(12) United States Patent
Lin et al.

(10) Patent No.: US 11,233,074 B2
(45) Date of Patent: Jan. 25, 2022

(54) ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventors: Zhenguo Lin, Shenzhen (CN); Xingyu Zhou, Shenzhen (CN); Yuanjun Hsu, Shenzhen (CN); Poyen Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 178 days.

(21) Appl. No.: 16/627,784

(22) PCT Filed: Dec. 20, 2019

(86) PCT No.: PCT/CN2019/126907
§ 371 (c)(1),
(2) Date: Dec. 31, 2019

(87) PCT Pub. No.: WO2021/097995
PCT Pub. Date: May 27, 2021

(65) Prior Publication Data
US 2021/0335851 A1 Oct. 28, 2021

(30) Foreign Application Priority Data

Nov. 19, 2019 (CN) .......................... 201911131998.8

(51) Int. Cl.
*H01L 27/00* (2006.01)
*H01L 27/12* (2006.01)

(52) U.S. Cl.
CPC ........ *H01L 27/1251* (2013.01); *H01L 27/127* (2013.01); *H01L 27/1225* (2013.01); *H01L 27/1255* (2013.01); *H01L 27/1288* (2013.01)

(58) Field of Classification Search
CPC ............. H01L 27/1251; H01L 27/1225; H01L 27/1255; H01L 27/127; H01L 27/1288
See application file for complete search history.

(56) References Cited

U.S. PATENT DOCUMENTS

| 8,749,725 B2* | 6/2014 | Yoon | G02F 1/136213 349/38 |
| 2011/0309362 A1* | 12/2011 | Yoon | H01L 29/4908 257/59 |

\* cited by examiner

*Primary Examiner* — Nikolay K Yushin

(57) ABSTRACT

The present application provides an array substrate and a manufacturing method thereof. The array substrate includes a thin film transistor and a storage capacitor prepared on a substrate; the thin film transistor includes a gate, an active layer, and a source/drain; the storage capacitor includes a first electrode and a second electrode isolated therefrom by a dielectric layer; the gate is disposed above the first electrode and located at one end of the first electrode; and the second electrode corresponds to a portion of the first electrode non-corresponding to the gate.

15 Claims, 3 Drawing Sheets

```
┌─────────────────────────────────────────────┐
│ sequentially forming a first electrode layer and a gate layer on │──S10
│ the substrate;                              │
└─────────────────────────────────────────────┘
                      ⇩
┌─────────────────────────────────────────────┐
│ performing exposure and development on the first electrode │
│ layer and the gate layer by first half-tone masking, to │
│ simultaneously form a first electrode and a gate above the first │──S20
│ electrode, wherein the gate is correspondingly formed at one │
│ end of the first electrode;                 │
└─────────────────────────────────────────────┘
                      ⇩
┌─────────────────────────────────────────────┐
│ sequentially forming a dielectric layer, a patterned oxide │
│ semiconductor layer, and a source-drain metal layer on the gate │
│ and the first electrode, the oxide semiconductor layer │──S30
│ comprising an active layer and an oxide emiconductor pattern; │
└─────────────────────────────────────────────┘
                      ⇩
┌─────────────────────────────────────────────┐
│ performing exposure and development on the source-drain │
│ metal layer by second half-tone masking to expose the oxide │
│ semiconductor pattern, and conductorizing the oxide │
│ semiconductor pattern to form a second electrode, and then │──S40
│ forming a source/drain,                     │
│ wherein the first electrode and the second electrode are both │
│ transparent electrodes.                     │
└─────────────────────────────────────────────┘
```

FIG. 1

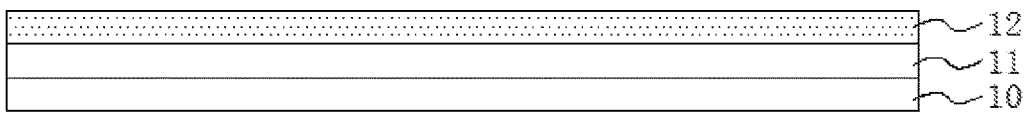

FIG. 2A

ARRAY SUBSTRATE AND MANUFACTURING METHOD THEREOF

RELATED APPLICATIONS

This application is a National Phase of PCT Patent Application No. PCT/CN2019/126907 having International filing date of Dec. 20, 2019, which claims the benefit of priority of Chinese Patent Application No. 201911131998.8 filed on Nov. 19, 2019. The contents of the above applications are all incorporated by reference as if fully set forth herein in their entirety.

FIELD AND BACKGROUND OF THE INVENTION

The present application relates to a field of display technology, and in particular, to an array substrate and a manufacturing method thereof.

DESCRIPTION OF PRIOR ART

One of the main problems of existing large-size and high-resolution display panels to be solved is the problem of aperture ratio, that is, thin film transistors (TFTs) and capacitors need to occupy as small area as possible to increase the area of the pixel light transmission region, thereby increasing the aperture ratio. However, the capacitors and TFTs need to have certain sizes to ensure good functionality. Therefore, reduction in the sizes of capacitors and TFTs in existing display panels is limited, and they still occupy certain pixel areas, which impacts the aperture ratio of the display panels.

Therefore, there is an urgent need to improve the defects of the existing technology.

SUMMARY OF THE INVENTION

The present application provides an array substrate and a method of manufacturing the same, which can increase the aperture ratio of a pixel, improve resolution of a display panel, provide a simple manufacturing method, and save manufacturing costs.

In order to solve the above problems, the technical solutions provided in the present application are as follows:

The present application provides an array substrate, including:

a substrate;

a thin film transistor disposed on the substrate; and a storage capacitor disposed on the substrate, wherein the storage capacitor includes a first electrode and a second electrode isolated therefrom by a dielectric layer, and the first electrode and the second electrode are both transparent electrodes.

In the array substrate of the present application, the thin film transistor includes a gate, an active layer, and a source/drain, wherein the gate is disposed on the first electrode and is located at one end of the first electrode;

the active layer is insulated from and disposed on the gate; and the source and the drain are respectively disposed at opposite ends of the active layer, and electrically connected to the active layer.

In the array substrate of the present application, the second electrode and the active layer are disposed on a same level and spaced apart from each other, the second electrode corresponds to a portion of the first electrode non-corresponding to the gate, and a gap is present between the second electrode and the source/drain.

In the array substrate of the present application, an orthographic projection of the gate on the substrate falls within an orthographic projection of the first electrode on the substrate.

In the array substrate of the present application, an orthographic projection of the second electrode on the substrate falls within an orthographic projection of the first electrode on the substrate.

In the array substrate of the present application, a passivation layer and a pixel electrode are further stacked on the thin film transistor and the storage capacitor, the passivation layer corresponding to the drain and the second electrode is provided with via holes, and the pixel electrode is electrically connected to the drain and the second electrode through the via holes, respectively.

In the array substrate of the present application, the second electrode is made of a material including one or more of indium gallium zinc oxides, indium tin zinc oxides, and indium gallium zinc tin oxides.

In the array substrate of the present application, the active layer is made of a same material as the second electrode, and the second electrode is formed by conductorization.

The present application also provides a method of manufacturing an array substrate, including the following steps:

step S10, sequentially forming a first electrode layer and a gate layer on the substrate;

step S20, performing exposure and development on the first electrode layer and the gate layer by first half-tone masking, to simultaneously form a first electrode and a gate above the first electrode, wherein the gate is correspondingly formed at one end of the first electrode;

step S30, sequentially forming a dielectric layer, a patterned oxide semiconductor layer, and a source/drain metal layer on the gate and the first electrode, the oxide semiconductor layer including an active layer and an oxide semiconductor pattern; and step S40, performing exposure and development on the source/drain metal layer by second half-tone masking to expose the oxide semiconductor pattern, and conductorizing the oxide semiconductor pattern to form a second electrode, and then forming a source/drain, wherein the first electrode and the second electrode are both transparent electrodes.

The present application also provides an array substrate, including:

a substrate;

a thin film transistor disposed on the substrate; and a storage capacitor disposed on the substrate, wherein the storage capacitor includes a first electrode and a second electrode isolated therefrom by a dielectric layer, the first electrode and the second electrode are both transparent electrodes, and the first electrode is made of a material including one or more of indium zinc oxides, aluminum zinc oxides, and indium aluminum zinc oxides.

In the array substrate of the present application, the thin film transistor includes a gate, an active layer, and a source/drain, wherein the gate is disposed on the first electrode and is located at one end of the first electrode;

the active layer is insulated from and disposed on the gate; and the source and the drain are respectively disposed at opposite ends of the active layer, and electrically connected to the active layer.

In the array substrate of the present application, the second electrode and the active layer are disposed on a same level and spaced apart from each other, the second electrode corresponds to a portion of the first electrode non-corresponding to the gate, and a gap is present between the second electrode and the source/drain.

In the array substrate of the present application, an orthographic projection of the gate on the substrate falls within an orthographic projection of the first electrode on the substrate.

In the array substrate of the present application, an orthographic projection of the second electrode on the substrate falls within an orthographic projection of the first electrode on the substrate.

In the array substrate of the present application, a passivation layer and a pixel electrode are further stacked on the thin film transistor and the storage capacitor, the passivation layer corresponding to the drain and the second electrode is provided with via holes, and the pixel electrode is electrically connected to the drain and the second electrode through the via holes, respectively.

In the array substrate of the present application, the second electrode is made of a material including one or more of indium gallium zinc oxides, indium tin zinc oxides, and indium gallium zinc tin oxides.

In the array substrate of the present application, the active layer is made of a same material as the second electrode, and the second electrode is formed by conductorization.

The beneficial effect of the present application is: compared with the existing array substrate, the array substrate and the manufacturing method thereof provided in the present application increase the aperture ratio of the pixel area and increase resolution, since the first electrode and the second electrode of the storage capacitor are formed of transparent materials, and the storage capacitor itself can transmit light and can be placed under the light emitting layer. In addition, the first electrode and the gate of the storage capacitor are formed simultaneously by half-tone masking, and during forming the source and drain, the second electrode is also conductorized. Therefore, this process can be completed without increase in a number of photomasks, saving manufacturing costs, and preventing etching residues from occurrence.

BRIEF DESCRIPTION OF THE SEVERAL VIEWS OF THE DRAWINGS

The following detailed description of specific embodiments of the present application will make the technical solutions and other beneficial effects of the present application obvious in conjunction with the drawings.

FIG. 1 is a flowchart of a method of manufacturing an array substrate according to an embodiment of the present application.

FIG. 2A to FIG. 2H are schematic diagrams of a method of manufacturing an array substrate according to an embodiment of the present application.

DESCRIPTION OF SPECIFIC EMBODIMENTS OF THE INVENTION

Figure 2B:
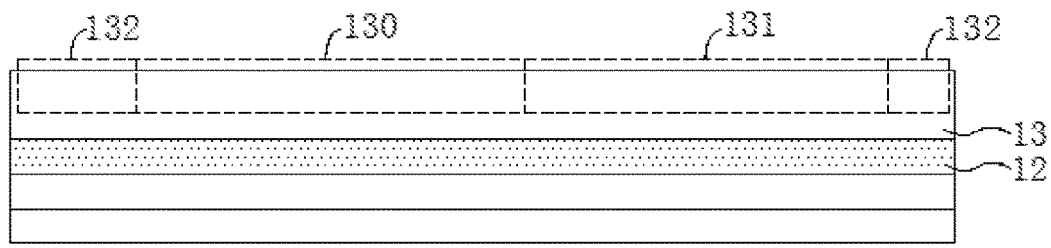

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

The present application is directed to solving the defect of the existing array substrate that the capacitor and the TFT occupy a certain pixel area, which impacts the aperture ratio of the display panel.

Referring to FIG. 1 and FIGS. 2A to 2H, the present application provides a method of manufacturing an array substrate. The method includes the following steps:

Step S10, sequentially forming a first electrode layer and a gate layer on the substrate.

As shown in FIG. 2A, the substrate 10 is first cleaned, and the substrate 10 may be a glass substrate. Then, a first electrode layer 11 and a gate layer 12 are formed on the substrate 10 sequentially.

The first electrode layer 11 is made of a material including, but s not limited to one or more of indium zinc oxide (InZnO, IZO), aluminum zinc oxide (AlZnO, AZO), and indium aluminum zinc oxide (InAlZnO, IAZO), and has a film thickness of 300 angstroms to 2000 angstroms. The gate layer 12 is made of a material including, but not limited to, one or more of Mo, Al, Cu, and Ti, and has a film thickness of 500 angstroms to 10000 angstroms.

Step S20, performing exposure and development on the first electrode layer and the gate layer by first half-tone masking, to simultaneously form a first electrode and a gate above the first electrode, wherein the gate is correspondingly formed at one end of the first electrode.

Specifically, the step S20 includes the following steps:

In step S201, as shown in FIG. 2B, a first photoresist layer 13 is formed on the gate layer 12, and the first photoresist layer 13 includes a completely opaque region 130 corresponding to the gate to be formed, a completely transparent region 132 corresponding to a portion other than the first electrode to be formed, and a remaining partially transparent region 131, wherein the first half-tone masking process is performed by using a first half-tone mask (not shown).

It can be understood that the portion of the first half-tone mask corresponding to the completely opaque area 130 is opaque, the portion of the first half-tone mask corresponding to the partially transparent area 131 is partially transparent, and the portion of the first half-tone mask corresponding to the completely transparent is completely transparent.

Figure 2C:
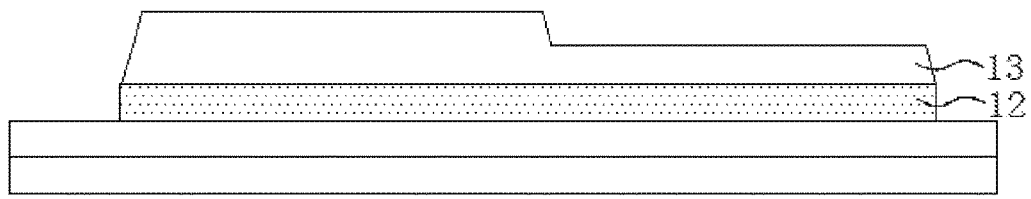

In step S202, as shown in FIG. 2C, the gate layer 12 is etched for a first time to remove the gate layer 12 corresponding to the completely transparent region 132.

After exposure and development, the first photoresist layer 13 and the gate layer 12 corresponding to the completely transparent region 132 are removed, so that the gate layer 12 forms an intermediate pattern.

Figure 2D:
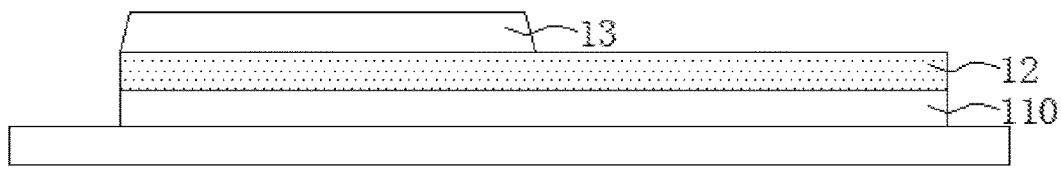

In step S203, as shown in FIG. 2D, the first electrode layer 11 is etched to remove the first electrode layer 11 corresponding to the completely transparent region 132 to form the first electrode 110.

The first electrode layer 11 is etched by wet etching with oxalic acid. After that, the first photoresist layer 13 of the partially transparent region 131 is removed.

Figure 2E:
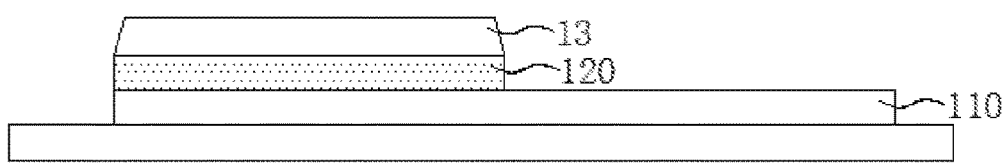

In step S204, as shown in FIG. 2E, the first photoresist layer 13 of the partially transparent region 131 is removed, and the gate layer 12 is etched for a second time to remove the gate layer 12 corresponding to the partially transparent region 131 to form the gate 120. After that, the remaining first photoresist layer 13 is removed.

Step S30, sequentially forming a dielectric layer, a patterned oxide semiconductor layer, and a source/drain metal layer on the gate and the first electrode, the oxide semiconductor layer including an active layer and an oxide semiconductor pattern.

Figure 2F:
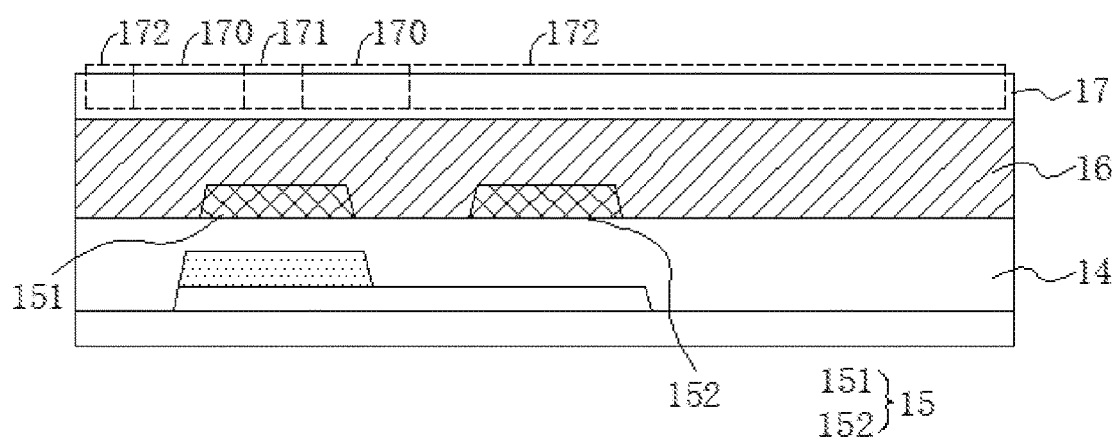

Specifically, the step S30 includes the following steps:

Step S301, as shown in FIG. 2F, a second photoresist layer 17 is formed on the source/drain metal layer 16, and the second photoresist layer 17 includes a completely opaque region corresponding to the source/drain to be formed, a partially transparent region 171 corresponding to a position between the source and the drain, and a remaining completely transparent region 172.

Specifically, the dielectric layer 14 is formed on the gate 120, the patterned oxide semiconductor layer 15 is formed on the dielectric layer 14, the source/drain metal layer 16 is formed on the oxide semiconductor layer 15, a second photoresist layer 17 is formed on the source/drain metal layer 16, and the second half-tone masking process is performed by using a second half-tone mask (not shown).

The dielectric layer 14 is made of a material including, but is not limited to, SiOx or SiNx, and has a thickness of 1000 angstroms to 5000 angstroms.

The oxide semiconductor layer 15 is made of a material including, but is not limited to, IGZO, IZTO, IGZTO, and the like, and has a thickness of 100 angstroms to 1000 angstroms.

The source/drain metal layer 16 is made of a material including, but not limited to, one or more of Mo, Al, Cu, Ti, and has a thickness of 2000 angstroms to 10000 angstroms.

The patterned oxide semiconductor layer 15 includes an active layer 151 and an oxide semiconductor pattern 152 which are spaced apart from each other.

Step S40, performing exposure and development on the source-drain metal layer by second half-tone masking to expose the oxide semiconductor pattern, and conductorizing the oxide semiconductor pattern to form a second electrode, and then forming a source/drain.

Figure 2G:
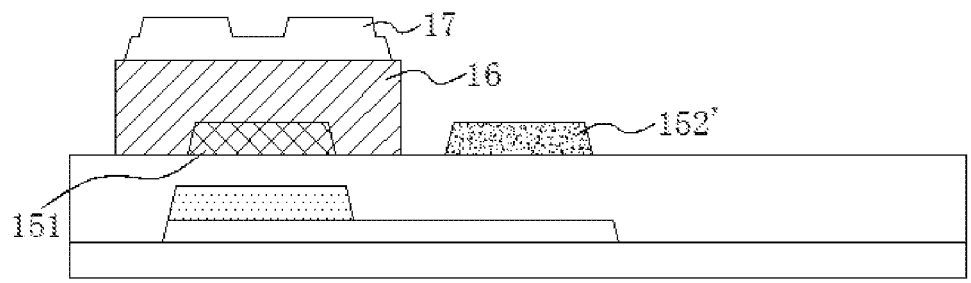

Specifically, the step S40 includes the following steps:

In step S401, as shown in FIG. 2G, the source/drain metal layer 16 is etched for a first time, the source/drain metal layer 16 corresponding to the completely transparent region 172 is removed to expose the oxide semiconductor pattern 152, and the oxide semiconductor pattern 152 is conductorized to form the second electrode 152'.

Specifically, the second photoresist layer 17 and the source/drain metal layer 16 corresponding to the completely transparent region 172 are removed, and the oxide semiconductor pattern 152 is exposed for conductorization. The source layer 151 is shielded by the source/drain metal layer 16 while still maintaining semiconductor characteristics. Since the oxide semiconductor pattern 152 is not protected by the source/drain metal layer 16, its resistance is significantly reduced after the processing, thus forming an N+ conductor layer, that is, the oxide semiconductor pattern 152 above the first electrode 110 is conductorized to form the second electrode 152' of the storage capacitor.

Figure 2H:
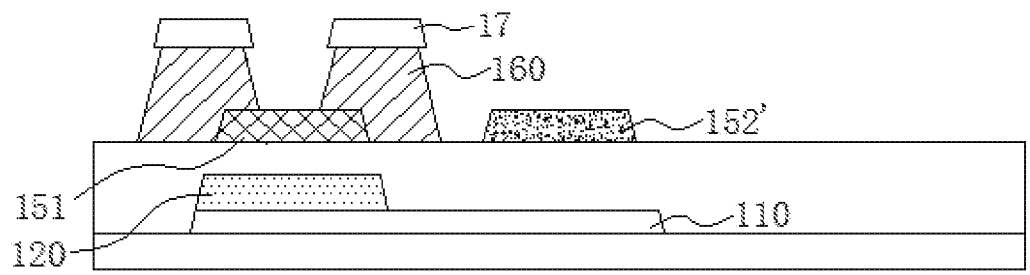

In step S402, as shown in FIG. 2H, the second photoresist layer 17 of the partially transparent region 171 is removed, and the source/drain metal layer 16 is etched for a second time to remove the source/drain metal layer 16 corresponding to the partially transparent region 171, to form the source/drain 160 electrically connected to the active layer 151.

After that, the second photoresist layer 17 is removed.

The method further includes forming a passivation layer on the source/drain 160 and defining via holes in the passivation layer; then forming a patterned pixel electrode on the passivation layer, wherein the pixel electrode is electrically connected to the source/drain 160 and the second electrode 152' through the via holes, respectively.

In this embodiment, the storage capacitor formed by the first electrode 110 and the second electrode 152' is made of a transparent material, and the storage capacitor and the thin film transistor are partially overlapped, that is, an orthographic projection of the gate 120 and the active layer 151 on the substrate 10 both fall within an orthographic projection of the first electrode 110 on the substrate 10. In this way, the aperture ratio of the pixel area is increased, thus increasing the resolution. In addition, the first electrode 110 and the gate 120 are formed simultaneously by half-tone masking, and during forming the source/drains 160, the second electrode 152' is also conductorized. Therefore, this process can be completed without increase in a number of photomasks, saving manufacturing costs, and preventing etching residues from occurrence (traditional ITO materials will have etching residues after wet etching).

Figure 3:
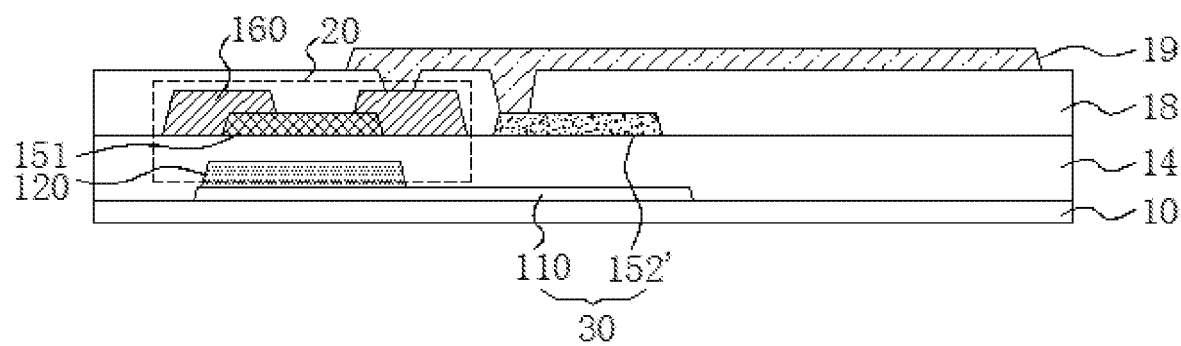
FIG. 3 is a schematic structural diagram of an array substrate according to an embodiment of the present application.

The present application also provides an array substrate prepared by using the above method. As shown in FIG. 3 in conjunction with FIGS. 2A to 2H, the array substrate includes a substrate 10, which may be a glass substrate or a flexible substrate; a thin film transistor 20 disposed on the substrate 10 at intervals; and a storage capacitor 30 disposed on the substrate 10.

The storage capacitor 30 includes a first electrode 110 and a second electrode 152' isolated therefrom by a dielectric layer 14, the first electrode 110 and the second electrode 152' are both transparent electrodes.

Specifically, the thin film transistor 20 includes a gate 120, an active layer 151, and a source/drain 160. The gate 120 is disposed on the first electrode 110 and is located at one end of the first electrode 110.

In one embodiment, an orthographic projection of the gate 120 on the substrate 10 falls within an orthographic projection of the first electrode 110 on the substrate 10, and an orthographic projection of the active layer 151 on the substrate 10 may also fall within the orthographic projection range of the first electrode 110 on the substrate 10. As a result, the thin film transistor 20 and the storage capacitor 30 are partially overlapped, thereby increasing the aperture ratio of the pixel.

The active layer 151 is insulated from and disposed on the gate 120. Specifically, the active layer 151 is disposed directly opposite to the gate 120 through the dielectric layer 14.

The source 160 and the drain 160 are respectively disposed at opposite ends of the active layer 151, and electrically connected to the active layer 151.

The second electrode 152' and the active layer 151 are disposed a same level and spaced apart from each other, the second electrode 152' corresponds to a portion of the first electrode 110 non-corresponding to the gate 120, and a gap is present between the second electrode and the source/drain 160, which are not in direct contact.

In an embodiment, an orthographic projection of the second electrode 152' on the substrate 10 and the orthographic projection of the first electrode 110 on the substrate 10 partially overlap each other, that is, the second electrode 152' may extend toward a side away from the source/drain 160 and extend correspondingly beyond the first electrode 110.

In one embodiment, the orthographic projection of the second electrode 152' on the substrate 10 completely falls within the orthographic projection range of the first electrode 110 on the substrate 10.

A passivation layer 18 and a pixel electrode 19 are further stacked on the thin film transistor 20 and the storage capacitor 30, the passivation layer 18 corresponding to the drain 160 and the second electrode 152' is provided with via holes, and the pixel electrode 19 is electrically connected to the drain 160 and the second electrode 152' through the via holes, respectively.

The first electrode 110 is made of a transparent material, including, but not limited to one or more of indium zinc oxide, aluminum zinc oxide, and indium aluminum zinc oxide. The second electrode 152' is also made of a transparent material, including, but not limited to one or more of indium gallium zinc oxide, indium tin zinc oxide, and indium gallium zinc tin oxide.

In addition, the active layer 151 is made of the same material as the second electrode 152', and the second electrode 152' is formed by conductorization, which is not repeated herein for brevity.

It can be understood that the array substrate further includes other conventional layers not illustrated in the figure, and details are not repeated herein for brevity.

In summary, the array substrate and the manufacturing method thereof provided in the present application increase the aperture ratio of the pixel area and increase resolution, since the first electrode and the second electrode of the storage capacitor are formed of transparent materials, and the storage capacitor itself can transmit light and can be placed under the light emitting layer. In addition, the first electrode and the gate of the storage capacitor are formed simultaneously by half-tone masking, and during forming the source and drain, the second electrode is also conductorized. Therefore, this process can be completed without increase in a number of photomasks, saving manufacturing costs, and preventing etching residues from occurrence.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An array substrate, comprising:
a substrate;
a thin film transistor disposed on the substrate; and
a storage capacitor disposed on the substrate,
wherein the storage capacitor comprises a first electrode and a second electrode isolated therefrom by a dielectric layer, and the first electrode and the second electrode are both transparent electrodes;
wherein the thin film transistor comprises a gate, an active layer, a source, and a drain; and
wherein the gate is disposed on the first electrode and is located at one end of the first electrode; the active layer is insulated from and disposed on the gate; and the source and the drain are respectively disposed at opposite ends of the active layer, and electrically connected to the active layer.

2. The array substrate according to claim 1, wherein the second electrode and the active layer are disposed on a same level and spaced apart from each other, the second electrode corresponds to a portion of the first electrode non-corresponding to the gate, and a gap is present between the second electrode and the source/drain.

3. The array substrate according to claim 1, wherein an orthographic projection of the gate on the substrate falls within an orthographic projection of the first electrode on the substrate.

4. The array substrate according to claim 2, wherein an orthographic projection of the second electrode on the substrate falls within an orthographic projection of the first electrode on the substrate.

5. The array substrate according to claim 1, wherein a passivation layer and a pixel electrode are further stacked on the thin film transistor and the storage capacitor, the passivation layer corresponding to the drain and the second electrode is provided with via holes, and the pixel electrode is electrically connected to the drain and the second electrode through the via holes, respectively.

6. The array substrate according to claim 1, wherein the second electrode is made of a material comprising one or more of indium gallium zinc oxides, indium tin zinc oxides, and indium gallium zinc tin oxides.

7. The array substrate according to claim 6, wherein the active layer is made of a same material as the second electrode, and the second electrode is formed by conductorization.

8. An array substrate, comprising:
a substrate;
a thin film transistor disposed on the substrate; and
a storage capacitor disposed on the substrate,
wherein the storage capacitor comprises a first electrode and a second electrode isolated therefrom by a dielectric layer, the first electrode and the second electrode are both transparent electrodes, and the first electrode is made of a material comprising one or more of indium zinc oxides, aluminum zinc oxides, and indium aluminum zinc oxides;
wherein the thin film transistor comprises a gate, an active layer, a source, and a drain; and
wherein the gate is disposed on the first electrode and is located at one end of the first electrode; the active layer is insulated from and disposed on the gate; and the source and the drain are respectively disposed at opposite ends of the active layer, and electrically connected to the active layer.

9. The array substrate according to claim 8, wherein the second electrode and the active layer are disposed on a same level and spaced apart from each other, the second electrode corresponds to a portion of the first electrode non-corresponding to the gate, and a gap is present between the second electrode and the source/drain.

10. The array substrate according to claim 9, wherein an orthographic projection of the second electrode on the substrate falls within an orthographic projection of the first electrode on the substrate.

11. The array substrate according to claim 8, wherein an orthographic projection of the gate on the substrate falls within an orthographic projection of the first electrode on the substrate.

12. The array substrate according to claim 8, wherein a passivation layer and a pixel electrode are further stacked on the thin film transistor and the storage capacitor, the passivation layer corresponding to the drain and the second electrode is provided with via holes, and the pixel electrode is electrically connected to the drain and the second electrode through the via holes, respectively.

13. The array substrate according to claim 8, wherein the second electrode is made of a material comprising one or more of indium gallium zinc oxides, indium tin zinc oxides, and indium gallium zinc tin oxides.

14. The array substrate according to claim 13, wherein the active layer is made of a same material as the second electrode, and the second electrode is formed by conductorization.

15. A method of manufacturing an array substrate, comprising the following steps:

step S10, sequentially forming a first electrode layer and a gate layer on the substrate;

step S20, performing exposure and development on the first electrode layer and the gate layer by first half-tone masking, to simultaneously form a first electrode and a gate above the first electrode, wherein the gate is correspondingly formed at one end of the first electrode;

step S30, sequentially forming a dielectric layer, a patterned oxide semiconductor layer, and a source-drain metal layer on the gate and the first electrode, the oxide semiconductor layer comprising an active layer and an oxide semiconductor pattern; and step S40, performing exposure and development on the source-drain metal layer by second half-tone masking to expose the oxide semiconductor pattern, and conductorizing the oxide semiconductor pattern to form a second electrode, and then forming a source/drain, wherein the first electrode and the second electrode are both transparent electrodes.

* * * * *